(12) United States Patent
Moroda et al.

(10) Patent No.: US 9,006,780 B2
(45) Date of Patent: Apr. 14, 2015

(54) SEMICONDUCTOR DEVICE

(71) Applicant: Renesas Electronics Corporation, Kawasaki-shi, Kanagawa (JP)

(72) Inventors: Aki Moroda, Kanagawa (JP); Kosuke Miyazaki, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 14/109,950

(22) Filed: Dec. 17, 2013

(65) Prior Publication Data

US 2014/0175507 A1      Jun. 26, 2014

(30) Foreign Application Priority Data

Dec. 20, 2012   (JP) ................................. 2012-278602

(51) Int. Cl.
H01L 29/74    (2006.01)
H01L 31/111   (2006.01)
H01L 29/747   (2006.01)
H01L 29/06    (2006.01)

(52) U.S. Cl.
CPC .......... H01L 29/747 (2013.01); H01L 29/0692 (2013.01)

(58) Field of Classification Search
CPC .................................................. H01L 29/747
USPC .................................... 257/120, 115; 438/135
See application file for complete search history.

(56) References Cited

U.S. PATENT DOCUMENTS 6,507,085 B2 *   1/2003   Shimizu ......................... 257/502
2005/0056906 A1 *   3/2005   Jimbo et al. ................... 257/492
2011/0220960 A1     9/2011   Moroda et al.

FOREIGN PATENT DOCUMENTS

JP          2011-192691 A      9/2011

* cited by examiner

Primary Examiner — Theresa T Doan
(74) Attorney, Agent, or Firm — Miles & Stockbridge P.C.

(57) ABSTRACT

Between a back surface electrode and an electrode, a first thyristor is formed of fifth and seventh semiconductor regions, a substrate region, first and second semiconductor regions and a third semiconductor region, and a second thyristor is formed of the second and first semiconductor regions, the substrate region, the seventh and fifth semiconductor regions and a sixth semiconductor region. Depths from the surface of the semiconductor substrate to bottom surfaces of the third and fourth semiconductor regions are 20 µm or more. The second semiconductor region with a high impurity concentration is enclosed by the first semiconductor region with a low impurity concentration, and a difference between a depth from the surface of the semiconductor substrate to the bottom of the second semiconductor region and a depth from the surface of the semiconductor substrate to the bottom of the first semiconductor region is less than 10 µm.

9 Claims, 12 Drawing Sheets

SEMICONDUCTOR DEVICE

CROSS-REFERENCE TO RELATED APPLICATIONS

The present application claims priority from Japanese Patent Application No. 2012-278602 filed on Dec. 20, 2012, the content of which is hereby incorporated by reference to this application.

TECHNICAL FIELD

The present invention relates to a semiconductor device, and particularly relates to techniques effectively applied to a semiconductor device provided with a triac.

BACKGROUND

A triac in which two complementary thyristors are connected in inverse parallel so that a current can flow bidirectionally is used for AC control or the like.

Patent Document 1 (Japanese Patent Application Laid-Open Publication No. 2011-192691) discloses the techniques for improving the switching performance of a triac, in particular, improvement in withstand voltage and suppression (prevention) of commutation failure.

SUMMARY

A triac is a device used for the AC control or the like, and it is desired that the performance of the triac (switching performance) is improved as much as possible because precise control is required. As the characteristics the improvement of which is particularly desired, there are improvement in withstand voltage and suppression (prevention) of commutation failure. Further, in order to achieve the low-current operation of the triac, reduction of a gate trigger current (IGT), that is, a gate current required to turn on the triac is necessary.

In the Patent Document 1, p type semiconductor regions constituting apart of a triac are separately formed as a p type semiconductor region with a high impurity concentration and a p type semiconductor region with a low impurity concentration, thereby achieving the improvement in withstand voltage and the suppression (prevention) of commutation failure.

However, according to the studies by the inventors of the present invention, it has been found that the withstand voltage characteristics and the commutation characteristics are both deteriorated in the triac structure disclosed in the Patent Document 1 when the gate trigger current (IGT) is lowered.

The other problems and novel characteristics of the present invention will be apparent from the description of the present specification and the accompanying drawings.

The following is a brief description of an outline of the typical means for solving the problems disclosed in the present application.

In a semiconductor device according to a typical embodiment, p type semiconductor regions constituting a part of a triac are separately formed as a p type semiconductor region with a high impurity concentration and a p type semiconductor region with a low impurity concentration, and the p type semiconductor region with a high impurity concentration is designed to have a large diffusion depth.

The following is a brief description of effects obtained by the typical means for solving the problems disclosed in the present application.

According to a typical embodiment, it is possible to realize a triac capable of a low-current operation while maintaining high withstand voltage characteristics and high commutation characteristics.

DETAILED DESCRIPTION

(1) Conventional Technique

First, the studies carried out by the inventors of the present invention prior to the present invention and the problems newly found as a result of the studies will be described below.

In a triac structure of a semiconductor device described in the Patent Document 1, in order to achieve the low-current operation by reducing the gate trigger current (IGT), an n type semiconductor region N3 with a high impurity concentration connected to an electrode E2 (gate terminal) of a triac and an n type semiconductor region N2 with a high impurity concentration adjacent to the semiconductor region N3 and connected to an electrode E1 (main electrode) of the triac are required to be formed more deeply than those of a conventional technique.

Figure 22:
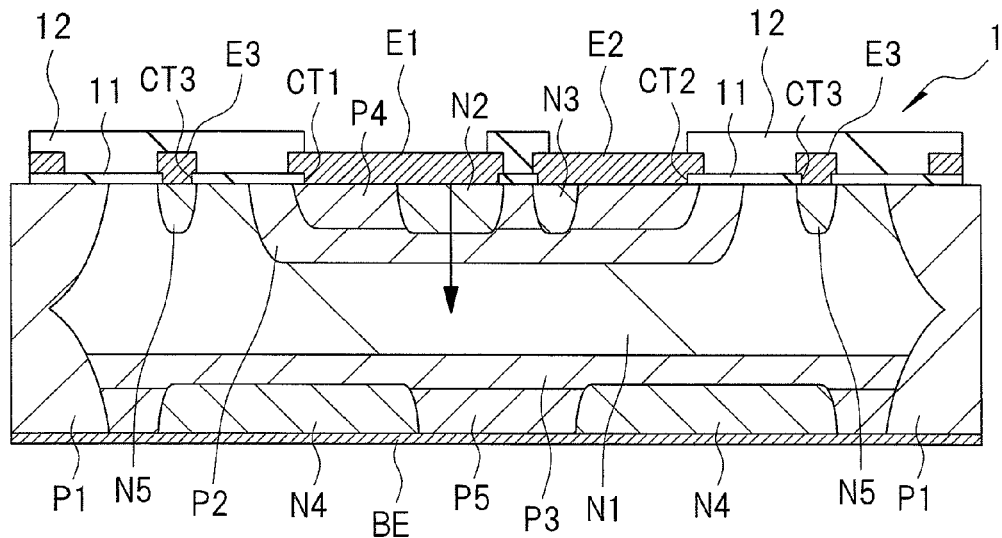
FIG. 22 is a sectional view showing a structure of a semiconductor device studied by the inventors of the present invention based on a semiconductor device of a conventional technique prior to the present invention.
Figure 23:
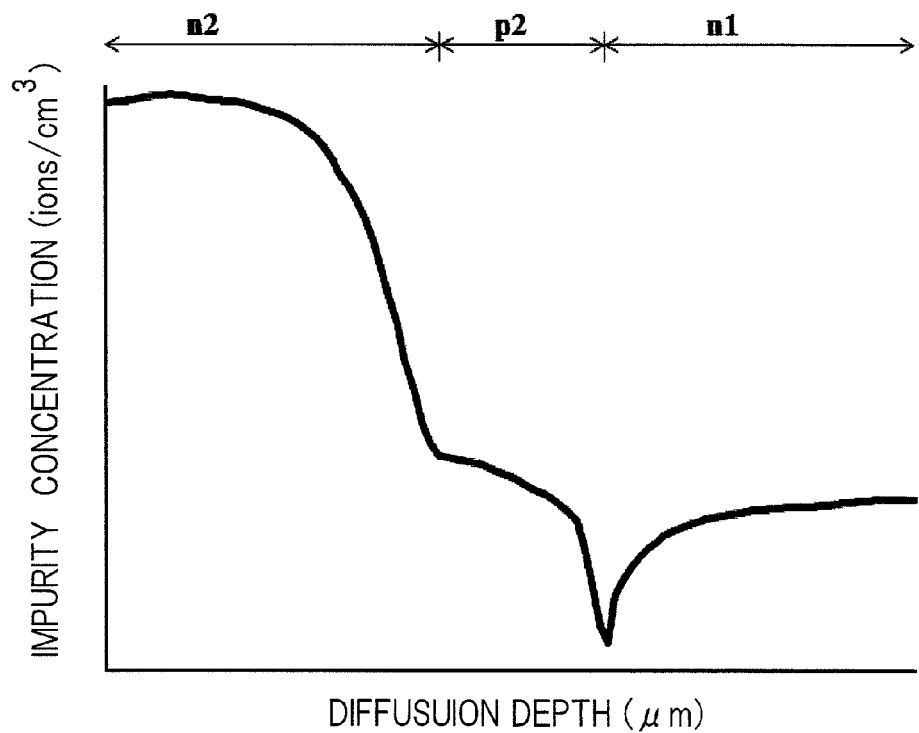
FIG. 23 is a graph showing an impurity concentration distribution of the semiconductor device shown in FIG. 22.

Thus, the inventors of the present invention have fabricated a semiconductor device with a triac structure in which the n type semiconductor regions N2 and N3 are formed deeply as shown in FIG. 22. FIG. 23 is a graph showing an impurity concentration distribution in the region from a front surface of a semiconductor substrate 1 to an n type substrate region N1 indicated by an arrow in FIG. 22. In FIG. 22 and FIG. 23, components having the same function as those of a semiconductor device of the first embodiment described later are denoted by the same reference signs.

In the triac structure shown in FIG. 22 and FIG. 23, when the p type impurity concentrations of the regions just below the n type semiconductor regions N2 and N3 are lowered, an electric field generated when a PN junction composed of the p type semiconductor region P2 and an n type substrate region N1 is inversely biased easily reaches the n type semiconductor region N2, and the withstand voltage of the triac is deteriorated.

Further, with respect to the commutation characteristics, when the p type impurity concentrations of the regions just below the n type semiconductor regions N2 and N3 are lowered, since the voltage fluctuation at the time of commutation is increased, the PN junction composed of the p type semiconductor region P2 and the n type substrate region N1 is easily forward biased, with the result that the commutation failure is more likely to occur.

As described above, there is a trade-off relationship between the gate trigger current (IGT) and the withstand voltage characteristics and the commutation characteristics of the triac, and it is difficult to reduce the gate trigger current (IGT) without deteriorating the withstand voltage characteristics and the commutation characteristics in the conventional technique (Patent Document 1) and the above-described technique studied by the inventors of the present invention.

(2) Details of Embodiment

Hereinafter, embodiments of the present invention will be described in detail with reference to the accompanying drawings. Note that components having the same function are denoted by the same reference signs throughout the drawings for describing the embodiments, and the repetitive description thereof will be omitted. Also, the description of the same or similar portions is not repeated in principle unless particularly required in the following embodiments. Further, in some drawings used for describing the embodiments, hatching is used even in a plan view and hatching is omitted even in a sectional view so as to make the configurations easily understood.

First Embodiment

Semiconductor Device

Figure 1:
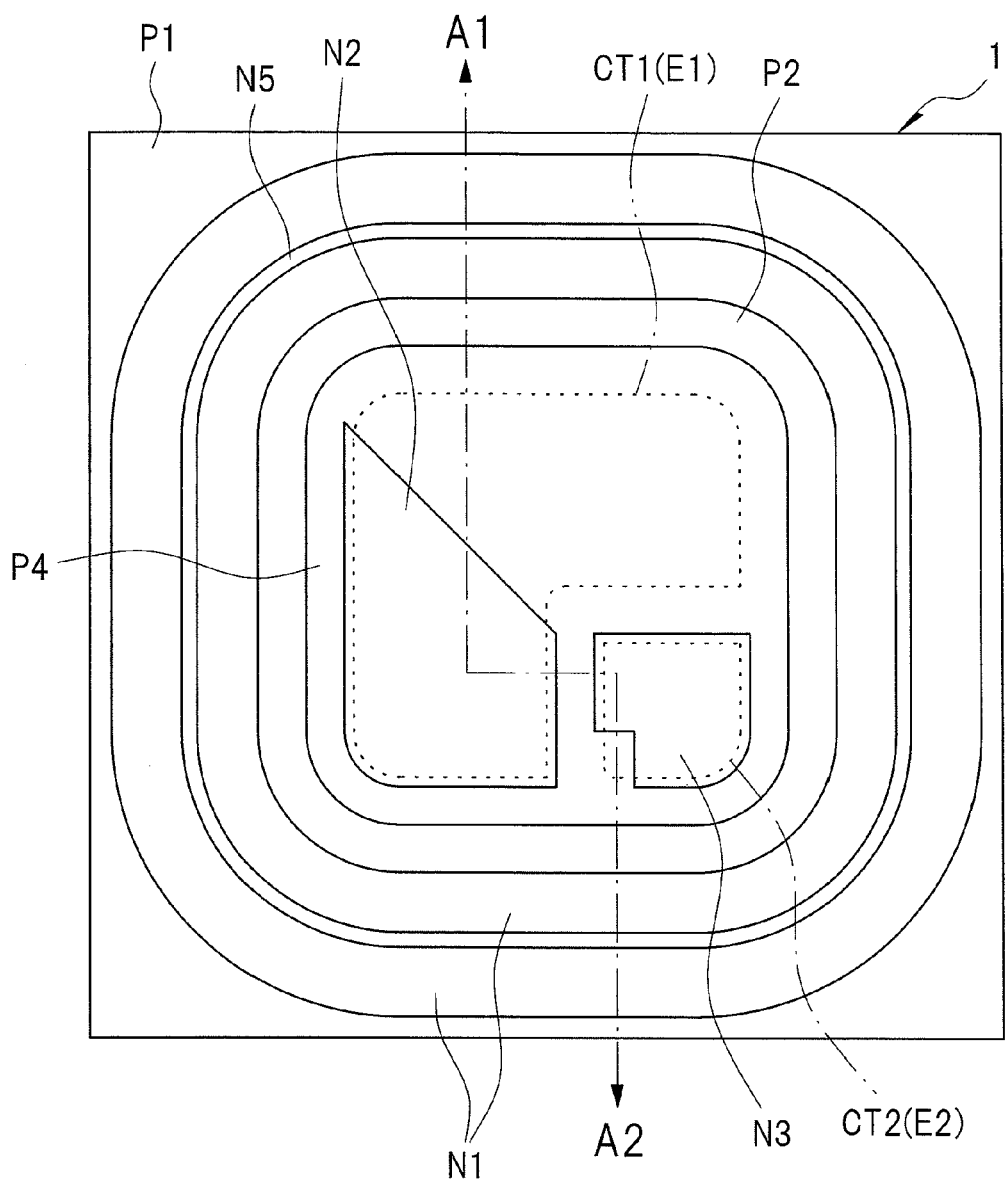
FIG. 1 is a plan view showing a semiconductor device of a first embodiment.
Figure 2:
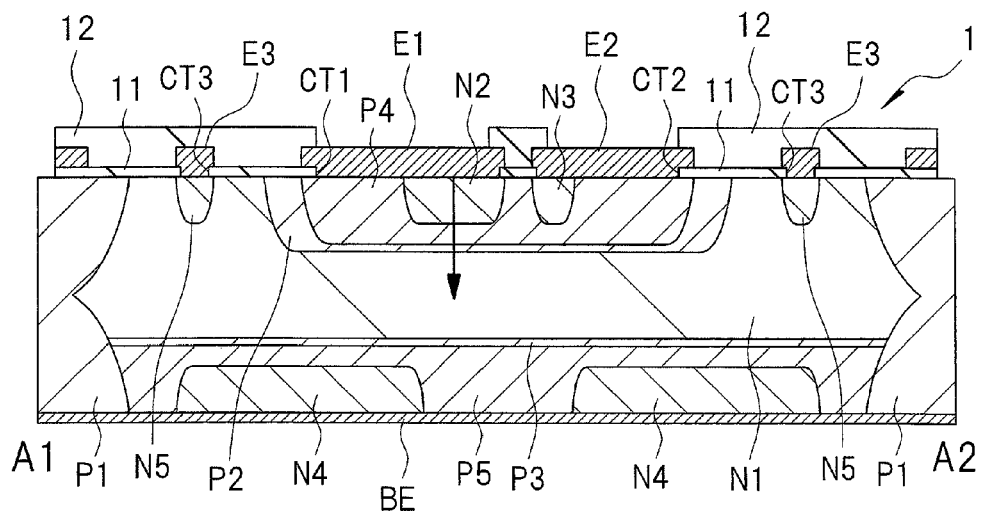
FIG. 2 is a sectional view showing the semiconductor device of the first embodiment.

FIG. 1 is a plan view of a semiconductor device of a first embodiment. FIG. 2 is a sectional view approximately corresponding to the cross-section taken along the line A1-A2 of FIG. 1. In FIG. 1, among the constituent elements of the triac, insulating films and electrodes are shown in a transparent manner, and a planar layout of the p type semiconductor regions, the n type substrate region and the n type semiconductor regions disposed on a front surface (first main surface) side of the semiconductor substrate is shown. Also, contact holes for electrodes are shown by broken lines.

In the semiconductor device of the first embodiment, a triac (bidirectional thyristor) is formed on a semiconductor substrate.

For example, in a semiconductor substrate (semiconductor chip) 1 made of an n type single crystal silicon with a thickness of about 150 to 300 μm, a p type semiconductor region (eighth semiconductor region) P1, a p type semiconductor region (first semiconductor region) P2, a p type semiconductor region (seventh semiconductor region) P3, a p type semiconductor region (second semiconductor region) P4, a p type semiconductor region (fifth semiconductor region) P5, an n type semiconductor region (third semiconductor region) N2, an n type semiconductor region (fourth semiconductor region) N3, an n type semiconductor region (sixth semiconductor region) N4 and an n type semiconductor region (ninth semiconductor region) N5 are formed. These semiconductor regions (P1-P5 and N2-N5) are formed by implanting impurities (p type impurity such as boron in the case of the p type semiconductor regions P1, P2, P3, P4 and P5 and n type impurity such as phosphorus in the case of the n type semiconductor regions N2, N3, N4 and N5) into the semiconductor substrate 1.

Among the semiconductor regions (P1-P5 and N2-N5), the p type semiconductor region P2, the p type semiconductor region P4, the n type semiconductor region N2, the n type semiconductor region N3 and the n type semiconductor region N5 are formed on the front surface (first main surface) side of the semiconductor substrate 1. Also, the p type semiconductor region P3, the p type semiconductor region P5 and the n type semiconductor region N4 are formed on the back surface (second main surface) side of the semiconductor substrate 1.

In the semiconductor substrate 1, a region in which the semiconductor regions (P1-P5 and N2-N5) are not formed is an n type substrate region N1. The n type substrate region N1 is composed of a part of the semiconductor substrate 1, and an impurity state (n type semiconductor state) of the semiconductor substrate 1 in the stage before the semiconductor regions (P1-P5 and N2-N5) are formed is maintained. The n type substrate region N1 is located between the p type semiconductor region P2 and the p type semiconductor region P3, and the n type substrate region N1 and the semiconductor regions (P1-P5 and N2-N5) constitute the semiconductor substrate 1 in combination.

Next, the semiconductor regions (P1-P5 and N2-N5) and the n type substrate region N1 will be described in detail.

First, the p type semiconductor region P1 is disposed in an outer circumferential part of the semiconductor substrate (semiconductor chip) 1, and is formed through the semiconductor substrate 1 from the front surface to the back surface. Therefore, on a side surface of the semiconductor substrate (semiconductor chip) 1, the p type semiconductor region P1 is exposed. Since the n type substrate region N1 is delimited (demarcated) by the p type semiconductor region P1, the circumference of the n type substrate region N1 is surrounded by the p type semiconductor region P1 when seen in a plan view. The p type semiconductor region P1 is in contact with the n type substrate region N1 and the p type semiconductor regions P3 and P5, but is formed away from the p type semiconductor regions P2 and P4 and the n type semiconductor regions N2, N3, N4 and N5.

The p type semiconductor region P2 is disposed near a center on a front surface side of the semiconductor substrate 1, and is formed so as to be enclosed by the n type substrate region N1. The p type semiconductor region P2 has a side surface and a bottom surface in contact with the n type substrate region N1, and an upper surface thereof is exposed on the front surface of the semiconductor substrate 1. The p type semiconductor region P2 is formed over a depth of about 20 to 50 µm from the front surface of the semiconductor substrate 1.

The p type semiconductor region P4 is disposed near a center on the front surface side of the semiconductor substrate 1, and is formed so as to be enclosed by the p type substrate region P2. The impurity concentration (p type impurity concentration) of the p type semiconductor region P4 is higher than the impurity concentration (p type impurity concentration) of the p type semiconductor region P2. More specifically, the specific resistance (resistivity) of the p type semiconductor region P4 is lower than the specific resistance (resistivity) of the p type semiconductor region P2.

Also, the p type semiconductor region P4 has a side surface and a bottom surface in contact with the p type semiconductor region P2, and an upper surface thereof is exposed on the front surface of the semiconductor substrate 1. More specifically, the p type semiconductor region P4 is not in contact with the n type substrate region N1, and the p type semiconductor region P2 is interposed between the p type semiconductor region P4 and the n type substrate region N1. Therefore, the depth (distance) from the front surface of the semiconductor substrate 1 to the bottom surface of the p type semiconductor region P4 is smaller than the depth (distance) from the front surface of the semiconductor substrate 1 to the bottom surface of the p type semiconductor region P2. The difference between the depth from the front surface of the semiconductor substrate 1 to the bottom surface of the p type semiconductor region P4 and the depth from the front surface of the semiconductor substrate 1 to the bottom surface of the p type semiconductor region P2 is, for example, less than 10 µm.

The n type semiconductor region N2 and the n type semiconductor region N3 are disposed near a center on the front surface side of the semiconductor substrate 1, and are formed so as to be enclosed by the p type semiconductor region P4. The impurity concentrations (n type impurity concentrations) of the n type semiconductor regions N2 and N3 are equal to each other and are higher than the impurity concentration (n type impurity concentration) of the n type substrate region N1. More specifically, the specific resistances (resistivities) of the n type semiconductor regions N2 and N3 are lower than the specific resistance of the n type substrate region N1.

The n type semiconductor region N2 and the n type semiconductor region N3 are formed away from each other, and the p type semiconductor region P4 is interposed therebetween. The n type semiconductor region N2 has a side surface and a bottom surface in contact with the p type semiconductor region P4, and an upper surface thereof is exposed on the front surface of the semiconductor substrate 1. Similarly, the n type semiconductor region N3 has a side surface and a bottom surface in contact with the p type semiconductor region P4, and an upper surface thereof is exposed on the front surface of the semiconductor substrate 1. The n type semiconductor region N2 and the n type semiconductor region N3 are formed over a depth of about 20 to 40 µm from the front surface of the semiconductor substrate 1. Also, the distance from the bottom surface of the n type semiconductor region N2 and/or the n type semiconductor region N3 to the bottom surface of the p type semiconductor region P4 is designed to be larger than the distance from the bottom surface of the p type semiconductor region P4 to the bottom surface of the p type semiconductor region P2.

The n type semiconductor region N5 is disposed on the front surface side of the semiconductor substrate 1, and is formed so as to be enclosed by the n type substrate region N1. The n type semiconductor region N5 has a side surface and a bottom surface in contact with then type substrate region N1, and an upper surface thereof is exposed on the front surface of the semiconductor substrate 1. More specifically, the n type semiconductor region N5 is disposed between the p type semiconductor region P2 and the p type semiconductor region P1, and is formed away from the p type semiconductor regions P1, P2 and P4 and the n type semiconductor regions N2 and N3. The impurity concentration (n type impurity concentration) of the n type semiconductor region N5 is higher than the impurity concentration (n type impurity concentration) of the n type substrate region N1, and is almost equal to the impurity concentrations (n type impurity concentrations) of the n type semiconductor regions N2 and N3. The n type semiconductor region N5 is formed over a depth of about 20 to 40 µm from the front surface of the semiconductor substrate 1.

Of the p type semiconductor regions P3 and P5 formed on the back surface (second main surface) side of the semiconductor substrate 1, the p type semiconductor region P5 is formed in a region in contact with the back surface of the semiconductor substrate 1, and the p type semiconductor region P3 is formed on an inner side of the semiconductor substrate 1 relative to the p type semiconductor region P5. More specifically, the p type semiconductor region P3 is interposed between the p type semiconductor region P5 and the n type substrate region N1. The difference between the depth from the back surface of the semiconductor substrate 1 to the bottom surface of the p type semiconductor region P5 (innermost part of the semiconductor substrate 1) and the depth from the back surface of the semiconductor substrate 1 to the bottom surface of the p type semiconductor region P3 is, for example, less than 10 µm. Also, when seen in a plan view, circumferences of the p type semiconductor regions P3 and P5 are surrounded by the p type semiconductor region P1, and side surfaces of the p type semiconductor regions P3 and P5 are in contact with the p type semiconductor region P1.

The impurity concentration (p type impurity concentration) of the p type semiconductor region P3 is almost equal to the impurity concentration (p type impurity concentration) of the p type semiconductor region P2 formed on the front surface side of the semiconductor substrate 1, and the impurity concentration (p type impurity concentration) of the p type semiconductor region P5 is almost equal to the impurity concentration (p type impurity concentration) of the p type semiconductor region P4 formed on the front surface side of the semiconductor substrate 1. More specifically, the impurity concentration (p type impurity concentration) of the p type semiconductor region P5 is higher than the impurity concentration (p type impurity concentration) of the p type semiconductor region P3.

The n type semiconductor region N4 formed on the back surface side of the semiconductor substrate 1 is formed so as to be enclosed by the p type semiconductor region P5. The n type semiconductor region N4 has a side surface and a bottom surface in contact with the p type semiconductor region P5, and an upper surface thereof is exposed on the back surface of the semiconductor substrate 1. Therefore, the n type semiconductor region N4 is not in contact with the p type semiconductor region P3 and the n type substrate region N1, and the p type semiconductor region P5 is interposed between the n type semiconductor region N4 and the p type semiconductor region P3.

The depth from the back surface of the semiconductor substrate 1 to the bottom surface of the n type semiconductor region N4 is smaller than the depth from the back surface of the semiconductor substrate 1 to the bottom surface of the p type semiconductor region P5. Also, the impurity concentration (n type impurity concentration) of the n type semiconductor region N4 is almost equal to the impurity concentrations (n type impurity concentrations) of the n type semiconductor regions N2, N3 and N5 formed on the front surface side of the semiconductor substrate 1. The n type semiconductor region N4 is formed over a depth of about 20 to 40 μm from the back surface of the semiconductor substrate 1.

The distance from the bottom surface of the p type semiconductor region P2 formed on the front surface side of the semiconductor substrate 1 to the upper surface of the p type semiconductor region P3 (that is, thickness of the n type substrate region N1 at a part located between the p type semiconductor region P2 and the p type semiconductor region P3) is, for example, about 50 to 260 μm. Here, the bottom surface of the p type semiconductor region P2 corresponds to the PN junction surface between the p type semiconductor region P2 and the n type substrate region N1, and the upper surface of the p type semiconductor region P3 corresponds to the PN junction surface between the p type semiconductor region P3 and the n type substrate region N1.

On the front surface of the semiconductor substrate 1, an insulating film 11 made of a PSG (Phospho Silicate Glass) film or the like is formed. Also, in this insulating film 11, a plurality of contact holes CT1, CT2 and CT3 exposing a part of the front surface of the semiconductor substrate 1 are formed.

The contact hole CT1 is formed so as to extend in both of the n type semiconductor region N2 and the p type semiconductor region P4, and at the bottom part of the contact hole CT1, at least a part of the n type semiconductor region N2 and a part of the p type semiconductor region P4 are exposed. The contact hole CT2 is formed so as to extend in both of the n type semiconductor region N3 and the p type semiconductor region P4, and at the bottom part of the contact hole CT2, at least a part of the n type semiconductor region N3 and a part of the p type semiconductor region P4 are exposed. The contact hole CT3 is formed on the n type semiconductor region N5, and at the bottom part of the contact hole CT3, a part of the n type semiconductor region N5 is exposed.

Also, an electrode (first electrode) E1, an electrode (second electrode) E2 and an electrode E3 are formed on the front surface of the semiconductor substrate 1. The electrode E1 is formed on the n type semiconductor region N2 and the p type semiconductor region P4 exposed at the bottom part of the contact hole CT1. The electrode E2 is formed on the n type semiconductor region N3 and the p type semiconductor region P4 exposed at the bottom part of the contact hole CT2. The electrode E3 is formed on the n type semiconductor region N5 exposed at the bottom part of the contact hole CT3.

The electrode E1 is electrically connected to the n type semiconductor region N2 and the p type semiconductor region P4, the electrode E2 is electrically connected to the n type semiconductor region N3 and the p type semiconductor region P4, and the electrode E3 is electrically connected to the n type semiconductor region N5. When seen in a plan view, the electrode E1 encloses the contact hole CT1, the electrode E2 encloses the contact hole CT2, and the electrode E3 encloses the contact hole CT3. Also, respective parts of the electrodes E1, E2 and E3 positioned outside the contact holes CT are located on the insulating film 11.

The electrodes E1, E2 and E3 are formed of a conductor film in the same layer, and are formed of a conductor film mainly made of, for example, aluminum. The electrodes E1, E2 and E3 are formed by forming the conductor film on the insulating film 11 so as to fill the contact holes CT and then patterning the conductor film.

On the uppermost layer on the front surface side of the semiconductor substrate 1, that is, on the insulating film 11, an insulating film 12 functioning as a surface protective film (passivation film) is formed. The insulating film 12 is made of, for example, polyimide resin.

A plurality of openings OP1 and OP2 are formed in the insulating film 12. Among these, the opening OP1 is formed on the electrode E1, and a part of the electrode E1 is exposed at the bottom part of the opening OP1. Also, the opening OP2 is formed on the electrode E2, and a part of the electrode E2 is exposed at the bottom part of the opening OP2. Meanwhile, the electrode E3 is covered with the insulating film 12 and is not exposed. When seen in a plan view, the electrode E3 has approximately the same shape as the n type semiconductor region N5, and has, for example, a ring-shape pattern surrounding the electrodes E1 and E2.

A part of the electrode E1 exposed from the opening OP1 and a part of the electrode E2 exposed from the opening OP2 constitute bonding pads, and bonding wires are connected to the surfaces thereof. Bump electrodes (protruding electrodes) may be formed on the surfaces of the electrodes E1 and E2 exposed from the openings OP1 and OP2 instead of the bonding wires.

Meanwhile, on the back surface of the semiconductor substrate 1, a back surface electrode (third electrode) BE electrically connected to both of the p type semiconductor region P5 and the n type semiconductor region N4 is formed. The back surface electrode BE is made of, for example, a metal film such as an Au (gold) film.

Also, in the semiconductor device of the first embodiment, the p type semiconductor region P1 is formed in an outer circumferential region of the semiconductor substrate (semiconductor chip) 1. Therefore, on the side surface of the semiconductor substrate 1, the n type substrate region N1 is not exposed, and the p type semiconductor region P1 is exposed. By forming the p type semiconductor region P1 in the outer circumferential region of the semiconductor substrate 1 in the above-described manner, it is possible to prevent the PN junction (PN junction between the n type substrate region N1 and the p type semiconductor region P3) from being exposed on the dicing surface (side surface of the semiconductor substrate 1).

Further, in the semiconductor device of the first embodiment, on the front surface side of the semiconductor substrate 1, the n type semiconductor region N5 with an impurity concentration (n type impurity concentration) higher than that of the n type substrate region N1 is formed between the p type semiconductor region P1 and the p type semiconductor region P2 (so as to surround the p type semiconductor region P2 when seen in a plan view), and the electrode E3 is formed on this n type semiconductor region N5. In this manner, it is possible to suppress the expansion of the electric field in a lateral direction of the semiconductor substrate 1 (direction horizontal to the main surface of the semiconductor substrate 1). Note that, in the case where the n type semiconductor region N5 and the n type semiconductor regions N2 and N3 are formed in different processes, the depth of the n type semiconductor region N5 may be different from those of the n type semiconductor regions N2 and N3.

Figure 3:
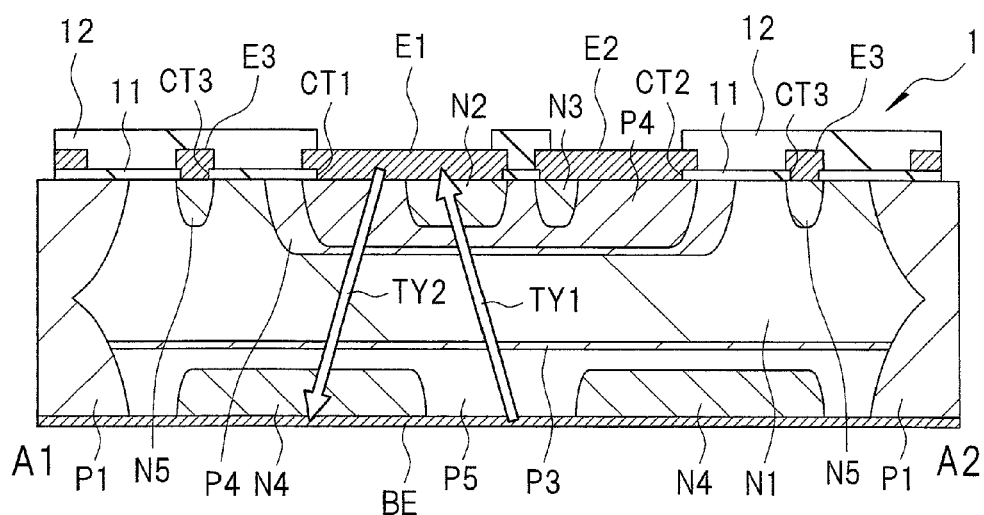
FIG. 3 is a sectional view showing the semiconductor device of the first embodiment.

Next, an operation of the triac provided in the semiconductor device of the first embodiment will be described. FIG. 3 is an explanatory diagram of the triac and shows the same cross-section as FIG. 2. Also, FIG. 3 schematically shows a current flowing through the thyristors by arrows.

The triac has a circuit configuration in which bidirectional thyristors TY1 and TY2 are connected in parallel to each other between the electrode E1 and the back surface electrode BE. In the thyristor TY1 and the thyristor TY2, directions of the current flowing between the electrode E1 and the back surface electrode BE are opposite to each other. More specifically, in the thyristor TY1, the back surface electrode BE side serves as an anode side and the electrode E1 side serves as a cathode side. On the other hand, in the thyristor TY2, the electrode E1 side serves as an anode side and the back surface electrode BE side serves as a cathode side.

The first thyristor TY1 is formed by connecting the p type semiconductor regions P5 and P3, the n type substrate region N1, the p type semiconductor regions P2 and P4 and the n type semiconductor region N2 in series in this order from the back surface electrode BE side between the back surface electrode BE and the electrode E1. Also, the second thyristor TY2 is formed by connecting the p type semiconductor regions P4 and P2, the n type substrate region N1, the p type semiconductor regions P3 and P5 and the n type semiconductor region N4 in series in this order from the electrode E1 side between the electrode E1 and the back surface electrode BE.

The electrode E2 functions as a gate terminal of each of the thyristors TY1 and TY2. For setting the thyristor TY1 to an on state (turned-on state), a voltage of a potential higher than the electrode E1 (for example, positive potential) is applied to the electrode E2 in the state where the back surface electrode BE has a potential higher than the electrode E1 (for example, in the state where a positive potential is applied to the back surface electrode BE and a negative potential is applied to the electrode E1). In this manner, the transistor composed of the n type semiconductor region N2, the p type semiconductor regions P4 and P2 and the n type substrate region N1 is first turned on, and the transistor composed of the p type semiconductor regions P4 and P2, the n type substrate region N1 and the p type semiconductor regions P3 and P5 is then turned on, so that the thyristor TY1 is turned on. When the thyristor TY1 is turned on, a current flows from the back surface electrode BE (anode in this case) to the electrode E1 (cathode in this case) through the p type semiconductor region P5, the p type semiconductor region P3, the n type substrate region N1, the p type semiconductor region P2, the p type semiconductor region P4 and the n type semiconductor region N2. More specifically, a current flows in the direction indicated by an arrow denoted by TY1 in FIG. 3.

Once the thyristor TY1 is in a turned-on state, the on state of the thyristor TY1 is maintained even when the application of a voltage (positive potential) to the electrode E2 (gate terminal) is stopped, and a current passage from the back surface electrode BE to the electrode E1 (current passage denoted by TY1 in FIG. 3) is continued. For stopping the conduction of the thyristor TY1 (turning off the thyristor TY1), the current passing between the back surface electrode BE and the electrode E1 needs to be set to have a predetermined current value or less. More specifically, once the thyristor TY1 is in an on state, the on state of the thyristor TY1 is maintained during the time when the current passing between the back surface electrode BE and the electrode E1 has a predetermined current value or more, but when the current value of the current passing between the back surface electrode BE and the electrode E1 is reduced to the predetermined current value or less, the conduction of the thyristor TY1 is stopped (turned off).

For setting the thyristor TY2 to an on state (turned-on state), a voltage of a potential lower than the electrode E1 (for example, negative potential) is applied to the electrode E2 in the state where the back surface electrode BE has a potential higher than the electrode E1 (for example, in the state where a negative potential is applied to the back surface electrode BE and a positive potential is applied to the electrode E1). In this manner, the transistor composed of the n type semiconductor region N3, the p type semiconductor regions P4 and P2 and the n type substrate region N1 is first turned on, the transistor composed of the p type semiconductor regions P4 and P2, the n type substrate region N1 and the p type semiconductor regions P3 and P5 is then turned on, and the transistor composed of the n type substrate region N1, the p type semiconductor regions P3 and P5 and the n type semiconductor region N4 is further turned on, so that the thyristor TY2 is turned on. When the thyristor TY2 is turned on, a current flows from the electrode E1 (anode in this case) to the back surface electrode BE (cathode in this case) through the p type semiconductor region P4, the p type semiconductor region P2, the n type substrate region N1, the p type semiconductor region P3, the p type semiconductor region P5 and the n type semiconductor region N4. More specifically, a current flows in the direction indicated by an arrow denoted by TY2 in FIG. 3.

Once the thyristor TY2 is in a turned-on state, the on state of the thyristor TY2 is maintained even when the application of a voltage (negative potential) to the electrode E2 (gate terminal) is stopped, and a current passage from the electrode E1 to the back surface electrode BE (current passage denoted by TY2 in FIG. 3) is continued. For stopping the conduction of the thyristor TY2 (turning off the thyristor TY2), the current passing between the electrode E1 and the back surface electrode BE needs to be set to have a predetermined current value or less. More specifically, once the thyristor TY2 is in an on state, the on state of the thyristor TY2 is maintained during the time when the current passing between the electrode E1 and the back surface electrode BE has a predetermined current value or more, but when the current value of the current passing between the electrode E1 and the back surface electrode BE is reduced to the predetermined current value or less, the conduction of the thyristor TY2 is stopped (turned off).

Figure 4:
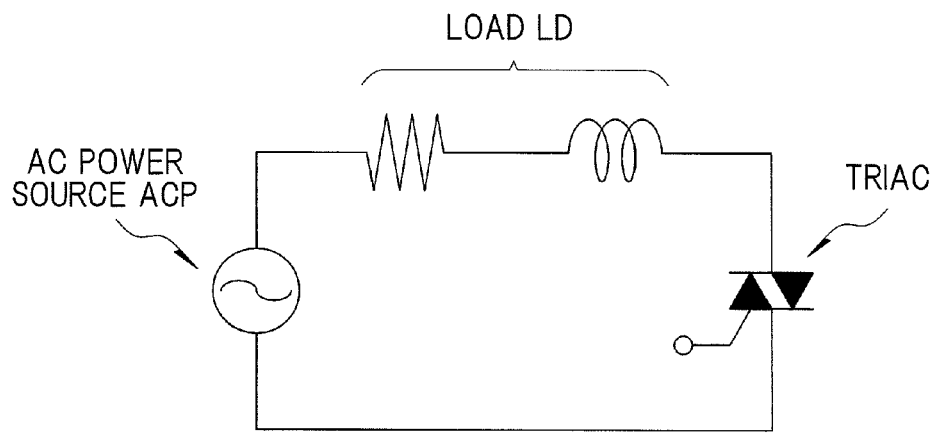
FIG. 4 is a circuit diagram showing an example of use of a triac.

FIG. 4 is a circuit diagram showing an example of use of a triac. The triac can be used as a device for AC control, and a load LD and the triac are connected in series with each other to an AC power source ACP for use as shown in FIG. 4. In the example shown in FIG. 4, one of two main terminals corresponding to the electrode E1 and the back surface electrode BE of the triac is connected to one terminal of the AC power source ACP through the load LD, and the other is connected to the other terminal of the AC power source ACP.

In the semiconductor device of the first embodiment, the p type semiconductor regions P4 and P2 are disposed on the front surface side of the semiconductor substrate 1, and the p type semiconductor region P2 has a low impurity concentration and the p type semiconductor region P4 has an impurity concentration higher than that of the p type semiconductor region P2. Also, the p type semiconductor regions P5 and P3 are disposed on the back surface side of the semiconductor substrate 1, and the p type semiconductor region P3 has a low impurity concentration and the p type semiconductor region P5 has an impurity concentration higher than that of the p type semiconductor region P3. The n type semiconductor region N2 and the n type semiconductor region N3 are formed away from each other on the front surface side of the semiconductor substrate 1 so as to be enclosed by the p type semiconductor region P4 with a high impurity concentration. Also, the n type semiconductor region N4 is formed on the back surface side of the semiconductor substrate 1 so as to be enclosed by the p type semiconductor region P5 with a high impurity concentration.

The PN junction surface between the n type substrate region N1 and the p type semiconductor region P2 with a low impurity concentration and the PN junction surface between the n type substrate region N1 and the p type semiconductor region P3 with a low impurity concentration form the PN junction which determines the withstand voltage in the triac (thyristors TY1 and TY2). Since the p type semiconductor region P2 with a low impurity concentration is interposed between the n type substrate region N1 and the p type semiconductor region P4 with a high impurity concentration and the p type semiconductor region P3 with a low impurity concentration is interposed between the n type substrate region N1 and the p type semiconductor region P5 with a high impurity concentration, the p type semiconductor regions P4 and P5 with a high impurity concentration do not form the PN junction with the n type substrate region N1.

As described above, in the first embodiment, since the PN junction surfaces which determine the withstand voltage of the triac, that is, the p type semiconductor regions which form the PN junction surfaces with the n type substrate region N1 are the p type semiconductor regions P2 and P3 with a low impurity concentration, it is possible to suppress the electric field concentration near the PN junction surfaces (PN junction surface between the n type substrate region N1 and the p type semiconductor region P2 and the PN junction surface between the n type substrate region N1 and the p type semiconductor region P3). Therefore, it is possible to improve the withstand voltage of the triac.

Also, in the first embodiment, the n type semiconductor regions N2 and N3 are formed so as to be enclosed by the p type semiconductor region P4 with a high impurity concentration, and the p type semiconductor region P4 with a high impurity concentration is interposed between the n type semiconductor regions N2 and N3 and the p type semiconductor region P2 with a low impurity concentration. Further, the n type semiconductor region N4 is formed so as to be enclosed by the p type semiconductor region P5 with a high impurity concentration, and the p type semiconductor region P5 with a high impurity concentration is interposed between the n type semiconductor region N4 and the p type semiconductor region P3 with a low impurity concentration. Therefore, it is possible to suppress or prevent the occurrence of the commutation failure of the triac formed in the semiconductor device.

More specifically, the commutation failure occurs by the unintentional turn-on of the thyristor TY1 due to the injection of electrons from the n type semiconductor region N2 to the p type semiconductor region P4 without the application of a gate voltage (input voltage to the electrode E2). In the first embodiment, since the impurity concentration in the p type semiconductor region P4 is increased, the number of holes in the p type semiconductor region P4 can be increased. Therefore, even if the phenomenon in which some electrons are injected from the n type semiconductor region N2 to the p type semiconductor region P4 without applying a gate voltage occurs, the electrons injected to the p type semiconductor region P4 can be annihilated by the combination with the holes in the p type semiconductor region P4. Consequently, it is possible to suppress or prevent the thyristor TY1 from unintentionally turning on without the application of a gate voltage.

Also, the commutation failure occurs by the unintentional turn-on of the thyristor TY2 due to the injection of electrons from the n type semiconductor region N4 to the p type semiconductor region P5 without the application of a gate voltage (input voltage to the electrode E2). For its solution, in the first embodiment, since the impurity concentration in the p type semiconductor region P5 is increased, the number of holes in the p type semiconductor region P5 can be increased. Therefore, even if the phenomenon in which some electrons are injected from the n type semiconductor region N4 to the p type semiconductor region P5 without applying a gate voltage occurs, the electrons injected to the p type semiconductor region P5 can be annihilated by the combination with the holes in the p type semiconductor region P5. Consequently, it is possible to suppress or prevent the thyristor TY2 from unintentionally turning on without the application of a gate voltage.

In other words, by designing the p type semiconductor region P4 to have a high impurity concentration so that electrons injected from the n type semiconductor region N2 to the p type semiconductor region P4 when no gate voltage is applied can be annihilated by the holes in the p type semiconductor region P4, the unintentional turn-on of the thyristor TY1 can be suppressed or prevented, and the commutation failure of the triac can be suppressed or prevented. Further, by designing the p type semiconductor region P5 to have a high impurity concentration so that electrons injected from the n type semiconductor region N4 to the p type semiconductor region P5 when no gate voltage is applied can be annihilated by the holes in the p type semiconductor region P5, the unintentional turn-on of the thyristor TY2 can be suppressed or prevented, and the commutation failure of the triac can be suppressed or prevented. More specifically, by forming the p type semiconductor regions P4 and P5 with a high impurity concentration, the voltage fluctuation due to the carriers at the time of commutation can be suppressed, and a current change rate (di/dt) c of the limit at which the commutation failure may occur can be increased.

Also, when the thyristor TY1 is intentionally turned on, electrons are sufficiently injected from the n type semiconductor region N2 to the p type semiconductor region P4 by applying a gate voltage. Therefore, even when the impurity concentration of the p type semiconductor region P4 is high, the thyristor TY1 can be reliably turned on without any influence from the high impurity concentration. Similarly, when the thyristor TY2 is intentionally turned on, electrons are sufficiently injected from the n type semiconductor region N4 to the p type semiconductor region P5 by applying a gate voltage. Therefore, even when the impurity concentration of the p type semiconductor region P5 is high, the thyristor TY2 can be reliably turned on without any influence from the high impurity concentration.

As described above, according to the first embodiment, the withstand voltage of a triac can be improved, and the commutation failure can be suppressed or prevented. More specifically, since both of the improvement in the withstand voltage of a triac and the suppression (prevention) of the commutation failure can be simultaneously achieved, the performance of a semiconductor device provided with the triac can be improved.

Also, in the first embodiment, since the triac itself is devised so as to make the commutation failure less likely to occur, the commutation failure can be suppressed or prevented without using an additional device such as a CR absorber. Further, when the CR absorber is used, the number of circuit elements is increased, which leads the increase in manufacturing cost and size of an electronic device. However, since the additional device is not necessary in the first embodiment, the reduction in cost and size of the electronic device provided with the semiconductor device of the first embodiment can be achieved.

Figure 5:
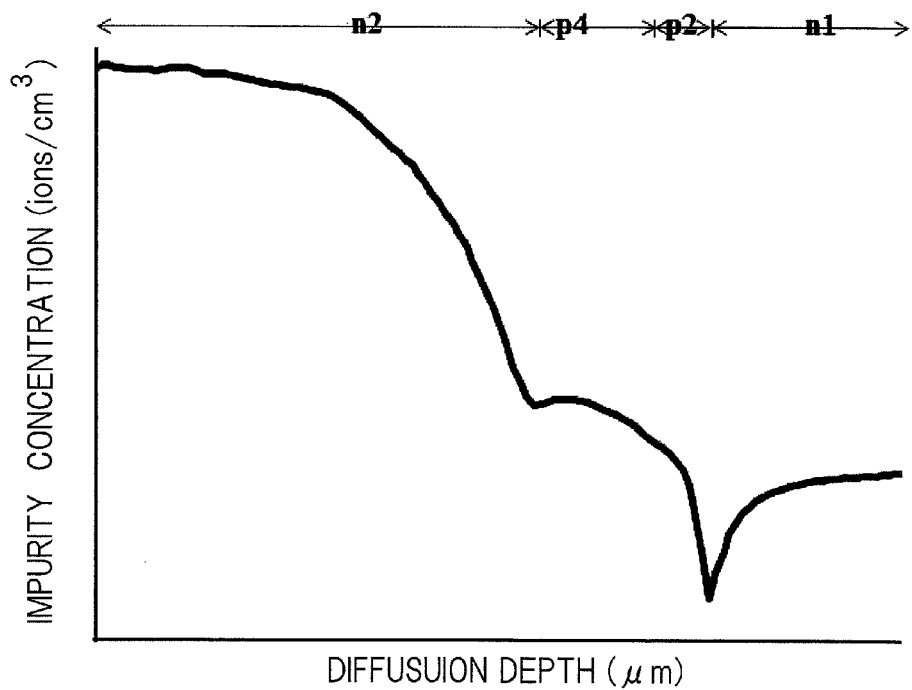
FIG. 5 is a graph showing an impurity concentration distribution of the semiconductor device of the first embodiment.

In the first embodiment, the triac is further devised as follows. FIG. 5 is a graph showing an impurity concentration distribution in the region from the front surface of the semiconductor substrate 1 to the n type substrate region N1 indicated by an arrow in FIG. 2.

In the first embodiment, in order to reduce the gate trigger current (IGT), the n type semiconductor regions N2 and N3 are formed more deeply than those of the conventional technique (Patent Document 1), so that the specific resistance of the p type semiconductor regions P2 and P4 just below the n type semiconductor regions N2 and N3 is reduced. More specifically, the n type semiconductor regions N2 and N3 which are formed over the depth of about 2 to 20 μm from the front surface of the semiconductor substrate 1 in the conventional technique are formed over the depth of about 20 to 40 μm from the front surface of the semiconductor substrate 1.

Further, in the first embodiment, the p type semiconductor region P4 with a high impurity concentration is also formed deeply, and the difference between the depth from the front surface of the semiconductor substrate 1 to the bottom surface of the p type semiconductor region P4 and the depth from the front surface of the semiconductor substrate 1 to the bottom surface of the p type semiconductor region P2 is less than 10 μm. As a result, in the first embodiment, although the n type semiconductor regions N2 and N3 are formed deeply, as can be seen from the graph showing the impurity concentration distribution in FIG. 5, the p type impurity concentration in the region just below the n type semiconductor regions N2 and N3 is relatively higher than that of the example of the technique studied by the inventors of the present invention shown in FIG. 22 and FIG. 23.

Accordingly, in the first embodiment, since the electric field generated when the PN junction composed of the p type semiconductor region P2 and the n type substrate region N1 is inversely biased is less likely to reach the n type semiconductor region N2, the reduction in withstand voltage of the triac can be suppressed or prevented. Furthermore, with respect to the commutation characteristics, since the voltage fluctuation at the time of the commutation is reduced, the occurrence of the commutation failure of the triac can be suppressed or prevented. More specifically, in the triac structure of the first embodiment, the low-current operation can be achieved by reducing the gate trigger current (IGT) while maintaining the high withstand voltage characteristics and the high commutation characteristics.

Figure 6:
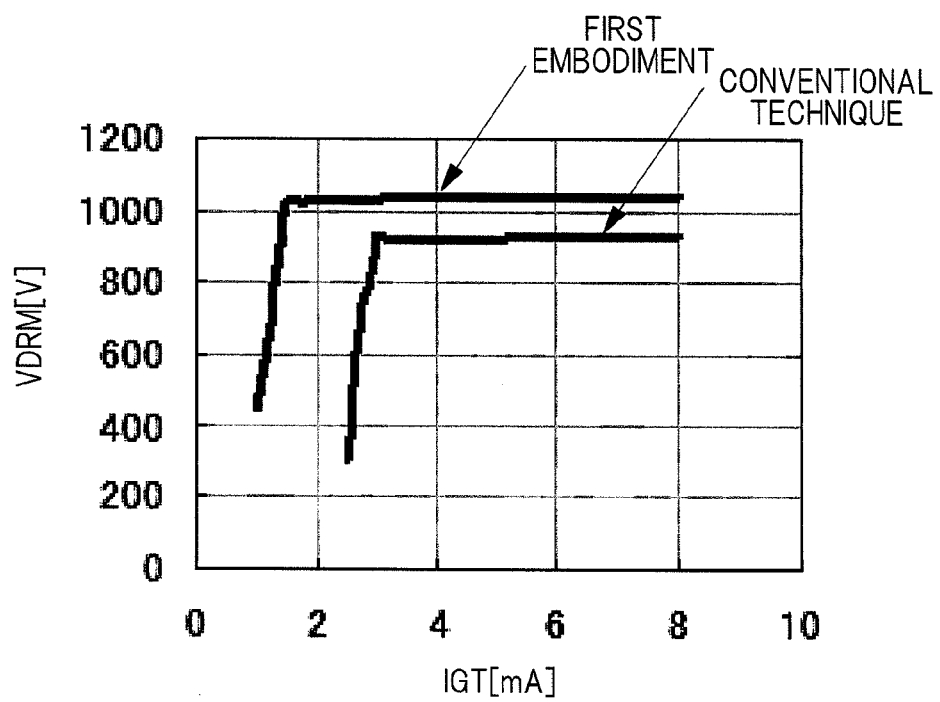
FIG. 6 is a graph showing a correlation between a gate trigger current (IGT) and a withstand voltage (VDRM) in the first embodiment and a conventional technique.

FIG. 6 shows a correlation between a gate trigger current (IGT) and a withstand voltage (VDRM) in the first embodiment and a conventional technique (Patent Document 1). In the case of the conventional technique, the withstand voltage drops in the range where the gate trigger current (IGT) is 3 mA or lower, but in the first embodiment, the withstand voltage is improved and the high withstand voltage is maintained even when the gate trigger current (IGT) is reduced to about 1.5 mA.

Figure 7:
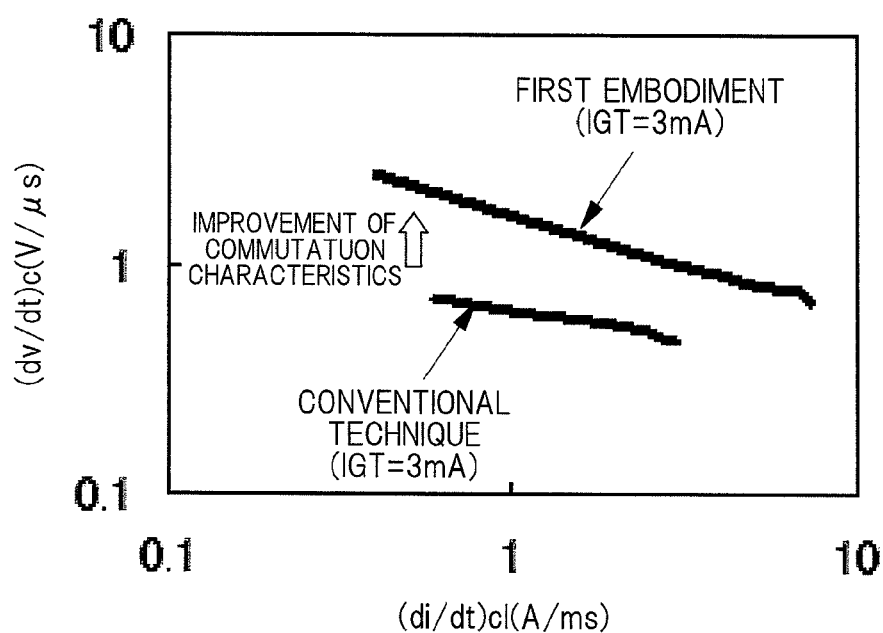
FIG. 7 is a graph showing commutation characteristics in the first embodiment and the conventional technique.

FIG. 7 shows commutation characteristics (current change rate (di/dt) c and voltage change rate (dv/dt) c) in the first embodiment and the conventional technique. When compared at the same gate trigger current (IGT) and the same current change rate (di/dt) c, it can be understood that the voltage change rate (dv/dt) c is improved in the first embodiment.

Manufacturing Method of Semiconductor Device

Next, an example of the manufacturing method of the semiconductor device of the first embodiment will be described with reference to drawings. FIG. 8 to FIG. 16 are sectional views in the manufacturing process of the semiconductor device (sectional views of one chip area of a wafer).

Figure 8:
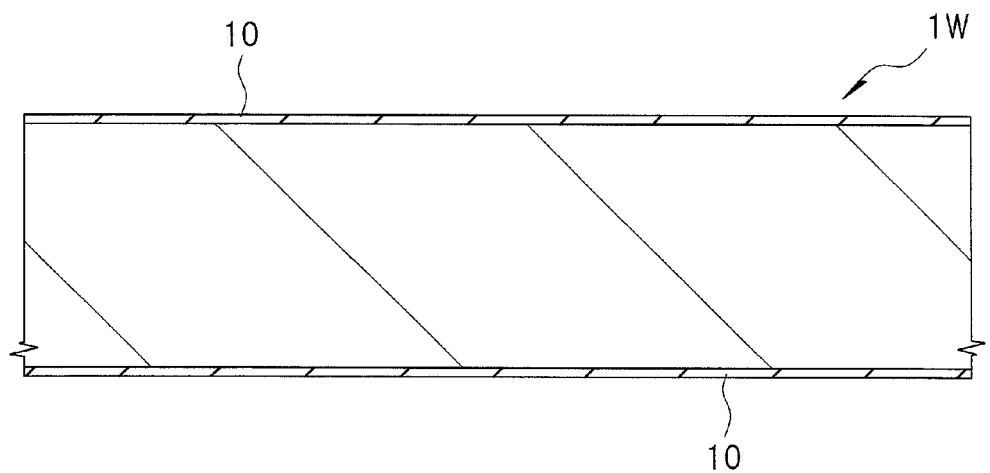
FIG. 8 is a main-part sectional view showing a manufacturing method of the semiconductor device of the first embodiment.

First, as shown in FIG. 8, silicon oxide films 10 are formed by oxidizing a front surface (first main surface) and a back surface (second main surface) of a semiconductor substrate (semiconductor wafer) 1W made of an n type single crystal silicon with a specific resistance of, for example, about 10 to 100 Ωcm.

Figure 9:
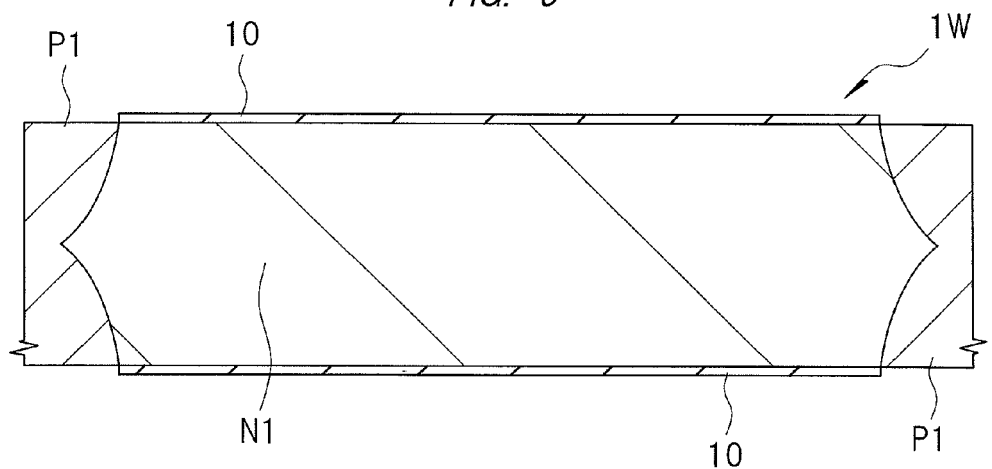
FIG. 9 is a main-part sectional view in the manufacturing process continued from FIG. 8.

Next, as shown in FIG. 9, after the silicon oxide films 10 in an outer circumferential part of the chip area are removed on the front surface and the back surface of the semiconductor substrate 1W, a p type impurity such as boron (B) is introduced into the front surface and the back surface of the semiconductor substrate 1W, thereby forming the p type semiconductor region P1.

The introduction of a p type impurity for forming the p type semiconductor region P1 is carried out by making solid, liquid or gas containing the p type impurity into contact with the front surface and the back surface of the semiconductor substrate 1W and then performing a thermal treatment at 1250 to 1300° C. for about 50 to 200 hours, thereby thermally diffusing the p type impurity to the inside of the semiconductor substrate 1W. Also, by forming the p type semiconductor region P1, the semiconductor substrate 1W in the region surrounded by the p type semiconductor region P1 serves as the n type substrate region N1.

Figure 10:
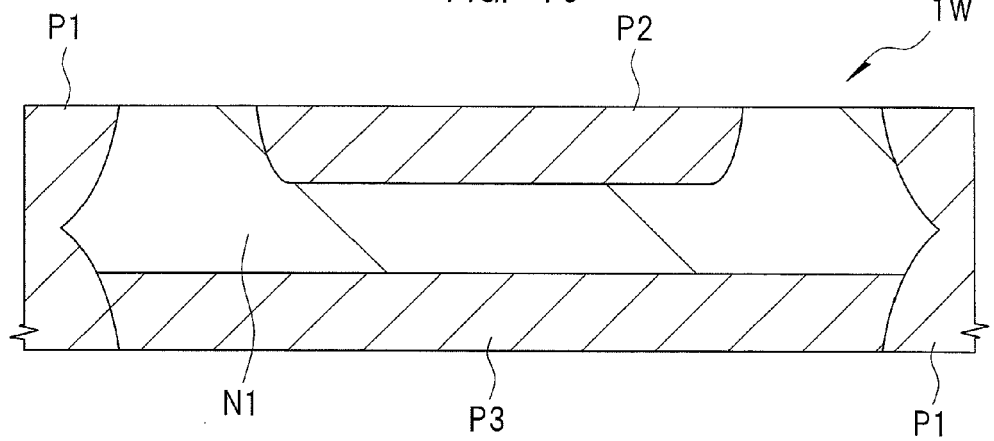
FIG. 10 is a main-part sectional view in the manufacturing process continued from FIG. 9.

Next, as shown in FIG. 10, after a p type impurity such as boron (B) is ion-implanted into the front surface and the back surface of the semiconductor substrate 1W, the semiconductor substrate 1W is subjected to the thermal treatment to diffuse the p type impurity, thereby forming the p type semiconductor region P2 on the front surface side of the semiconductor substrate 1W and the p type semiconductor region P3 on the back surface side of the semiconductor substrate 1W. The conditions of the thermal treatment for the thermal diffusion of the p type impurity for forming the p type semiconductor regions P2 and P3 are, for example, 1250 to 1300° C. and about 25 to 50 hours.

The p type semiconductor region P2 is formed over a depth of about 20 to 50 μm from the front surface of the semiconductor substrate 1W, and the p type semiconductor region P3 is formed over a depth of about 20 to 50 μM from the back surface of the semiconductor substrate 1W. Also, when the ion implantation for the p type semiconductor region P2 is carried out, the p type semiconductor region P2 is formed away from the p type semiconductor regions P1 by using a photoresist film as an ion implantation blocking mask or the like.

Figure 11:
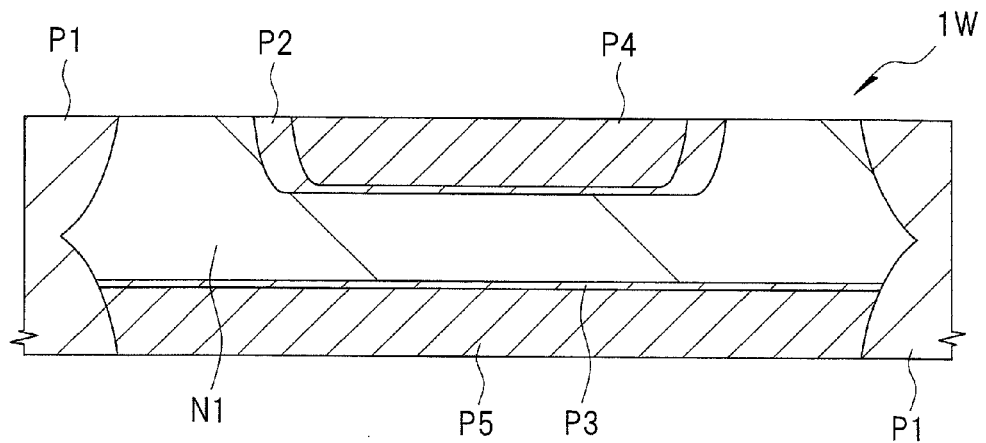
FIG. 11 is a main-part sectional view in the manufacturing process continued from FIG. 10.

Next, as shown in FIG. 11, after a p type impurity such as boron (B) is ion-implanted into the front surface and the back surface of the semiconductor substrate 1W, the semiconductor substrate 1W is subjected to the thermal treatment to diffuse the p type impurity, thereby forming the p type semiconductor region P4 on the front, surface side of the semiconductor substrate 1W and the p type semiconductor region P5 on the back surface side of the semiconductor substrate 1W. The conditions of the thermal treatment for the thermal diffusion of the p type impurity for forming the p type semiconductor regions P4 and P5 are, for example, 1250 to 1300° C. and about 10 to 30 hours.

The impurity concentrations of the p type semiconductor regions P4 and P5 are made higher than those of the p type semiconductor regions P2 and P3. Also, the p type semiconductor region P4 is formed so as to be shallower than the p type semiconductor region P2, and the difference in depth from the p type semiconductor region P2 is designed to be less than 10 μm. Similarly, the p type semiconductor region P5 is formed so as to be shallower than the p type semiconductor region P3, and the difference in depth from the p type semiconductor region P3 is designed to be less than 10 μm.

When the ion implantation for the p type semiconductor region P4 is carried out, the p type semiconductor region P4 is formed so as to be enclosed by the p type semiconductor region P2 by using a photoresist film as an ion implantation blocking mask or the like. Similarly, when the ion implantation for the p type semiconductor region P5 is carried out, the p type semiconductor region P5 is formed so as to be enclosed by the p type semiconductor regions P3 by using a photoresist film as an ion implantation blocking mask or the like.

Figure 12:
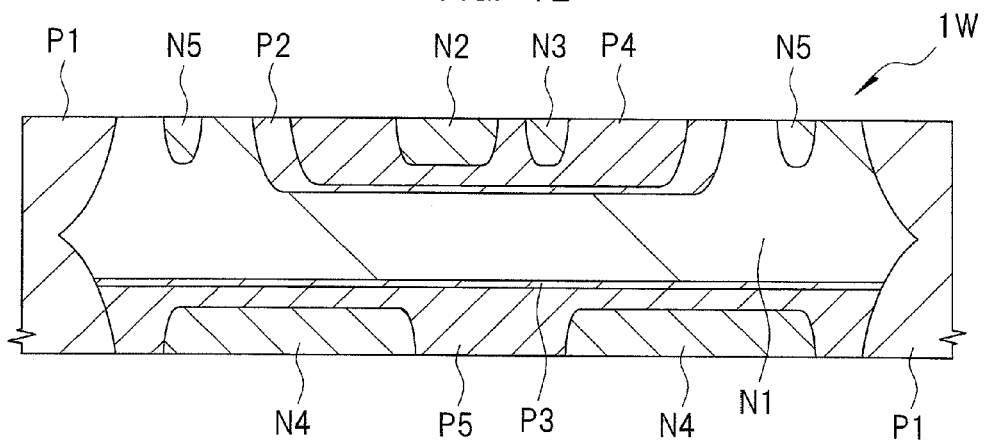
FIG. 12 is a main-part sectional view in the manufacturing process continued from FIG. 11.

Next, as shown in FIG. 12, an n type impurity such as phosphorus is introduced into the front surface and the back surface of the semiconductor substrate 1W, thereby forming the n type semiconductor regions N2, N3 and N5 on the front surface side of the semiconductor substrate 1W and the n type semiconductor region N4 on the back surface side of the semiconductor substrate 1W.

The introduction of an n type impurity for forming the n type semiconductor regions N2, N3, N4 and N5 is carried out by making solid, liquid or gas containing the n type impurity into contact with the front surface and the back surface of the semiconductor substrate 1W and then performing a thermal treatment at 1000 to 1250° C. for about 1 to 40 hours, thereby thermally diffusing the n type impurity to the inside of the semiconductor substrate 1W.

The impurity concentrations of the n type semiconductor regions N2, N3, N4 and N5 are made higher than that of the n type substrate region N1. Also, the n type semiconductor regions N2, N3 and N5 are formed over a depth of about 20 to 40 μm from the front surface of the semiconductor substrate 1W, and are formed so as to be shallower than the p type semiconductor region P4. Similarly, the n type semiconductor region N4 is formed over a depth of about 20 to 40 μm from the back surface of the semiconductor substrate 1W, and is formed so as to be shallower than the p type semiconductor region P5.

When the impurity for the n type semiconductor regions N2, N3 and N5 is introduced, a dopant source is partly supplied to the front surface of the semiconductor substrate 1W by using a photoresist pattern formed by a photolithography method, and the n type semiconductor regions N2 and N3 are formed away from each other so as to be enclosed by the p type semiconductor region P4. Also, the n type semiconductor region N5 is formed in a part of a surface portion of the n type substrate region N1.

Similarly, when the impurity for the n type semiconductor region N4 is introduced, a dopant source is partly supplied to the back surface of the semiconductor substrate 1W by using a photoresist pattern formed by a photolithography method, and the n type semiconductor region N4 is formed so as to be enclosed by the p type semiconductor region P5 by using a photoresist film as an impurity introduction blocking mask.

Figure 13:
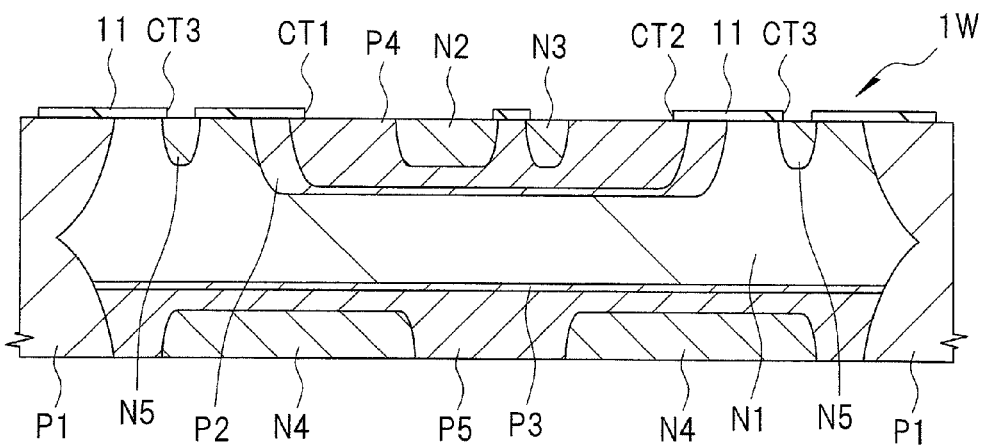
FIG. 13 is a main-part sectional view in the manufacturing process continued from FIG. 12.

Next, as shown in FIG. 13, after the insulating film 11 made of a PSG film or the like is formed on the front surface of the semiconductor substrate 1W, a plurality of contact holes CT1, CT2 and CT3 are formed in the insulating film 11 by using a photolithography method and an etching method. At the bottom part of the contact hole CT1, at least a part of the n type semiconductor region N2 and a part of the p type semiconductor region P4 are exposed, and at the bottom part of the contact hole CT2, at least a part of the n type semiconductor region N3 and a part of the p type semiconductor region P4 are exposed. Also, at the bottom part of the contact hole CT3, at least a part of the n type semiconductor region N5 is exposed.

Figure 14:
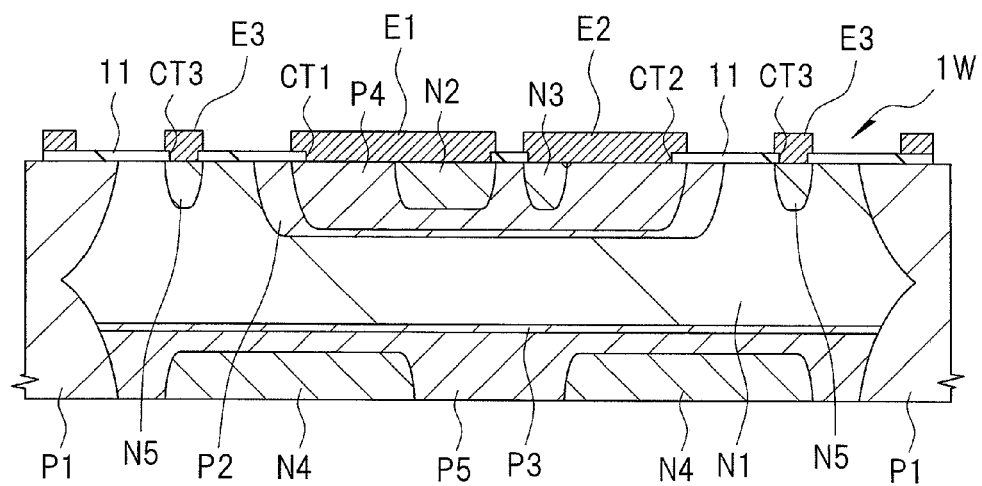
FIG. 14 is a main-part sectional view in the manufacturing process continued from FIG. 13.

Next, as shown in FIG. 14, after a conductor film made of an aluminum alloy film or the like is formed on the front surface of the semiconductor substrate 1W, the conductor film is patterned by using a photolithography method and an etching method, thereby forming the electrodes E1, E2 and E3. The electrode E1 is electrically connected to the n type semiconductor region N2 and the p type semiconductor region P4 through the contact hole CT1, and the electrode E2 is electrically connected to the n type semiconductor region N3 and the p type semiconductor region P4 through the contact hole CT2. Also, the electrode E3 is electrically connected to the n type semiconductor region N5 through the contact hole CT3.

Figure 15:
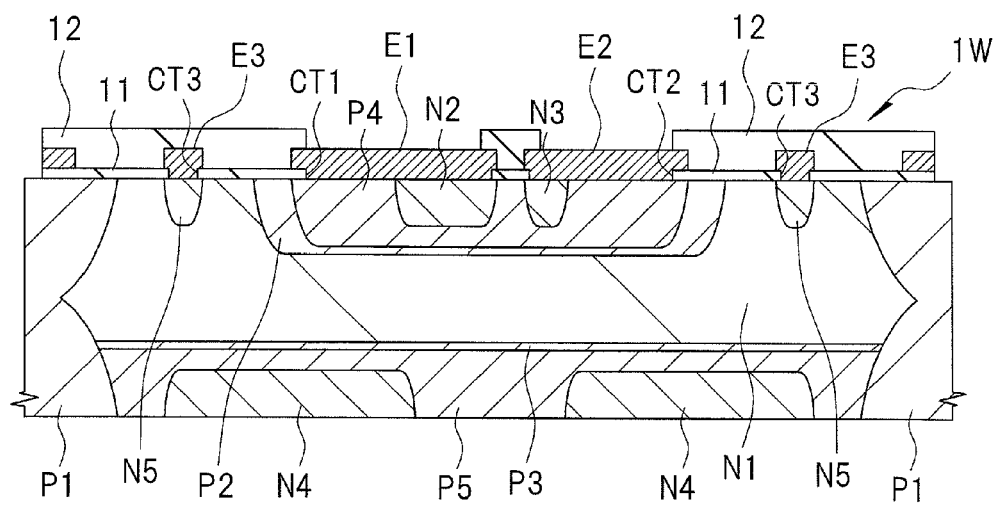
FIG. 15 is a main-part sectional view in the manufacturing process continued from FIG. 14.

Next, as shown in FIG. 15, after the insulating film 12 made of polyimide resin or the like is formed on the front surface of the semiconductor substrate 1W, a plurality of openings OP1 and OP2 are formed in the insulating film 12 by using a photolithography method and an etching method. At the bottom part of the opening OP1, a part of the electrode E1 is exposed, and at the bottom part of the opening OP2, a part of the electrode E2 is exposed.

Figure 16:
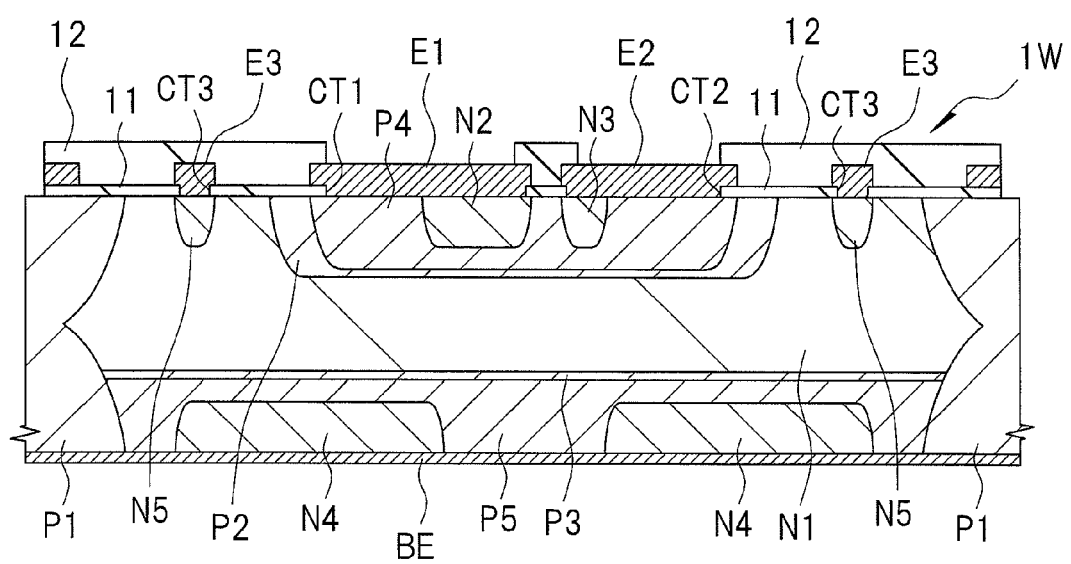
FIG. 16 is a main-part sectional view in the manufacturing process continued from FIG. 15.

Next, as shown in FIG. 16, an Au film or the like is formed on the back surface of the semiconductor substrate 1W, thereby forming the back surface electrode BE. The back surface electrode BE is electrically connected to the n type semiconductor region N4 and the p type semiconductor regions P1 and P5.

Thereafter, the semiconductor substrate 1W is cut (diced) into pieces of the respective chip areas, so that the semiconductor device of the first embodiment shown in FIG. 1 and FIG. 2 is completed.

Second Embodiment

Figure 17:
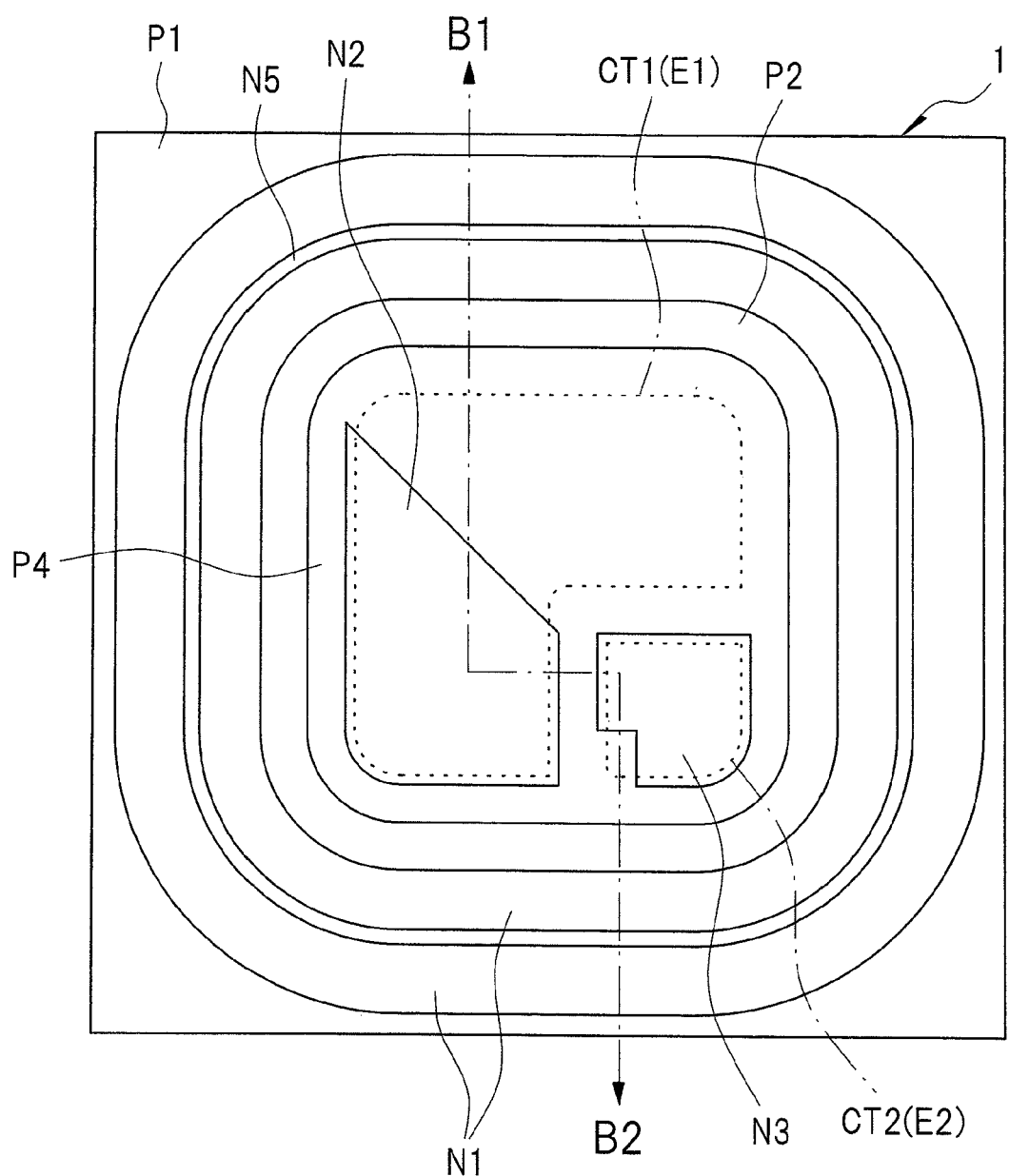
FIG. 17 is a plan view showing a semiconductor device of a second embodiment.
Figure 18:
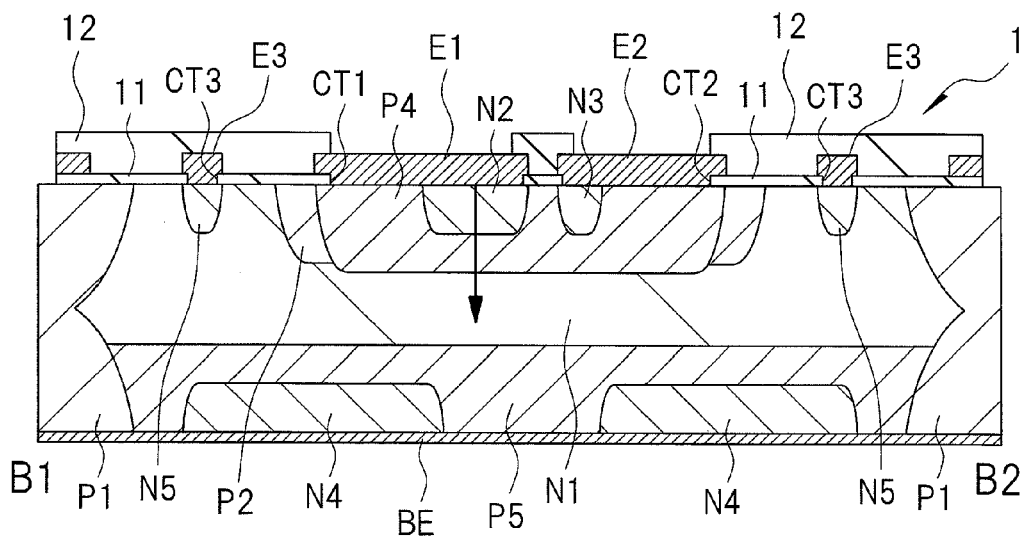
FIG. 18 is a sectional view showing the semiconductor device of the second embodiment.
Figure 19:
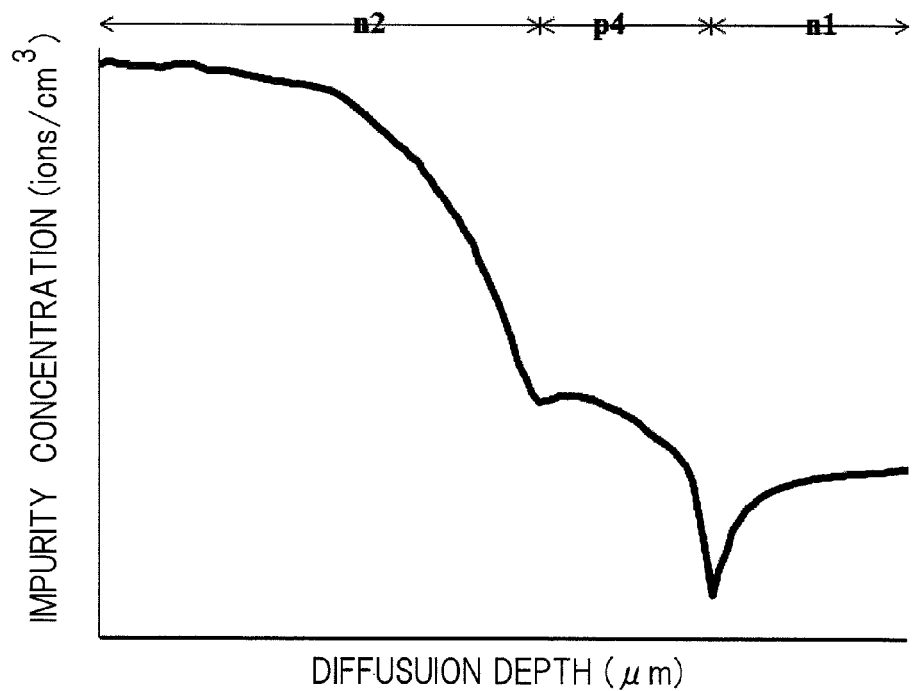
FIG. 19 is a graph showing an impurity concentration distribution of the semiconductor device of the second embodiment.

FIG. 17 is a plan view showing a semiconductor device of the second embodiment. FIG. 18 is a sectional view approximately corresponding to the cross-section taken along the line B1-B2 of FIG. 17. FIG. 19 is a graph showing an impurity concentration distribution in the region from the front surface of the semiconductor substrate 1 to the n type substrate region N1 indicated by an arrow in FIG. 18. In FIG. 17, among the constituent elements of the triac, insulating films and electrodes are shown in a transparent manner, and a planar layout of the p type semiconductor regions, the n type substrate region and the n type semiconductor regions disposed on a front surface side of the semiconductor substrate is shown like FIG. 1. Also, contact holes for electrodes are shown by broken lines.

The difference from the first embodiment is that the p type semiconductor regions P4 and P5 are formed more deeply. More specifically, in the second embodiment, the depth from the front surface of the semiconductor substrate 1 to the bottom surface of the p type semiconductor region P4 with a high impurity concentration is larger than the depth from the front surface of the semiconductor substrate 1 to the bottom surface of the p type semiconductor region P2 with a low impurity concentration. Similarly, the depth from the back surface of the semiconductor substrate 1 to the bottom surface of the p type semiconductor region P5 with a high impurity concentration is larger than the depth from the back surface of the semiconductor substrate 1 to the bottom surface of the p type semiconductor region P3 with a low impurity concentration.

On the other hand, when seen in a plan view, the p type semiconductor region P4 is disposed near a center on a front surface side of the semiconductor substrate 1, and is formed so as to be enclosed by the p type semiconductor region P2.

More specifically, the p type semiconductor region P4 has a side surface in contact with the p type semiconductor region P2 and an upper surface exposed on the front surface of the semiconductor substrate 1, and a bottom surface thereof is in contact with the n type substrate region N1 instead of the p type semiconductor region P2.

In the second embodiment, the first thyristor TY1 is formed by connecting the p type semiconductor region P5, the n type substrate region N1, the p type semiconductor region P4 and the n type semiconductor region N2 in series in this order from the back surface electrode BE side between the back surface electrode BE and the electrode E1. Also, the second thyristor TY2 is formed by connecting the p type semiconductor region P4, the n type substrate region N1, the p type semiconductor region P5 and the n type semiconductor region N4 in series in this order from the electrode E1 side between the electrode E1 and the back surface electrode BE.

As described above, in the second embodiment, the side surface of the p type semiconductor region P4 is in contact with the p type semiconductor region P2, and does not form the PN junction with the n type substrate region N1. Therefore, it is possible to suppress the electric field concentration near the PN junction surface (PN junction surface between the n type substrate region N1 and the p type semiconductor region P2). Also, although the n type semiconductor regions N2 and N3 are deeply formed over a depth of about 20 to 40 μm from the front surface of the semiconductor substrate 1, since the p type impurity concentrations just below the n type semiconductor regions N2 and N3 are relatively high, the electric field generated when the PN junction composed of the p type semiconductor region P2 and the n type substrate region N1 is inversely biased is less likely to reach the n type semiconductor region N2. Accordingly, it is possible to suppress or prevent the reduction in withstand voltage of the triac.

Also, with respect to the commutation characteristics, in the second embodiment, the n type semiconductor regions N2 and N3 are formed so as to be enclosed by the p type semiconductor region P4 with a high impurity concentration, and the p type semiconductor region P4 with a high impurity concentration is interposed between the n type semiconductor regions N2 and N3 and the p type semiconductor region P2 with a low impurity concentration. Further, the n type semiconductor region N4 is formed so as to be enclosed by the p type semiconductor region P5 with a high impurity concentration. Furthermore, since the p type semiconductor regions P4 and P5 are formed more deeply than the first embodiment so that the p type impurity concentration is made relatively high even in the region deep from the front surface and the back surface of the semiconductor substrate 1, the voltage fluctuation due to the carriers of the p type semiconductor region P4 can be reduced in comparison with the first embodiment. Therefore, it is possible to suppress or prevent the occurrence of the commutation failure of the triac more effectively in comparison with the first embodiment.

As described above, in the triac structure of the second embodiment, the low-current operation can be achieved by reducing the gate trigger current (IGT) while maintaining the high withstand voltage characteristics and the high commutation characteristics.

In the second embodiment, the p type semiconductor regions P4 and P5 with a high impurity concentration are formed more deeply than the p type semiconductor regions P2 and P3 with a low impurity concentration, but the depths from the front surface of the semiconductor substrate 1 to the bottom surfaces of the p type semiconductor regions P4 and P5 may be the same as the depths from the front surface of the semiconductor substrate 1 to the bottom surfaces of the p type semiconductor regions P2 and P3.

Also, when the p type semiconductor regions P4 and P5 are formed more deeply than the p type semiconductor regions P2 and P3, it is desired that the difference between the depth of the p type semiconductor region P4 and the depth of the p type semiconductor region P2 (difference between the depth of the p type semiconductor region P5 and the depth of the p type semiconductor region P3) is less than 5 μm. This is because when the difference is 5 μm or more, since the distance between the p type semiconductor region P4 and the p type semiconductor region P5 is shortened (that is, the thickness of a part of the n type substrate region N1 located between the p type semiconductor region P4 and the p type semiconductor region P5 is reduced), a depletion layer extending from the p type semiconductor region P4 reaches the p type semiconductor region P5 at the time of applying a voltage, which makes the punch through more likely to occur, and the withstand voltage is lowered.

Third Embodiment

Figure 20:
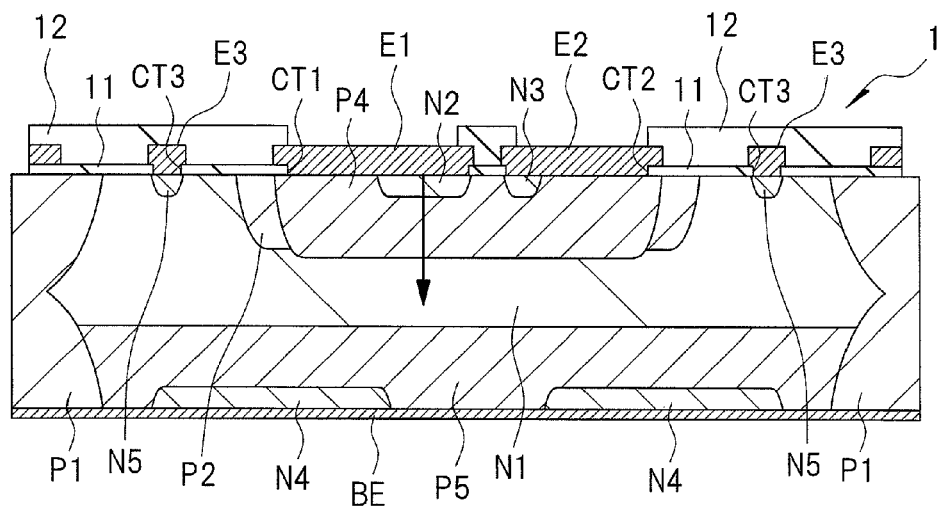
FIG. 20 is a sectional view showing a semiconductor device of a third embodiment.
Figure 21:
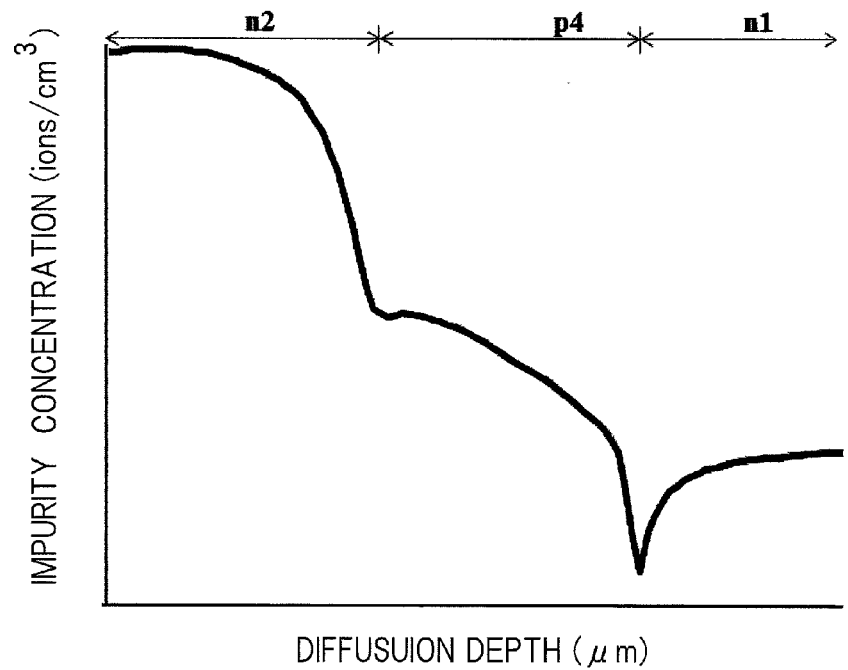
FIG. 21 is a graph showing an impurity concentration distribution of the semiconductor device of the third embodiment.

FIG. 20 is a sectional view showing a semiconductor device of the third embodiment. FIG. 21 is a graph showing an impurity concentration distribution in the region from the front surface of the semiconductor substrate 1 to the n type substrate region N1 indicated by an arrow in FIG. 20.

In the first and second embodiments, in order to reduce the gate trigger current (IGT) while maintaining the high withstand voltage characteristics and the high commutation characteristics, the n type semiconductor regions N2 and N3 and the p type semiconductor region P4 are formed more deeply than the conventional technique.

Meanwhile, in the third embodiment, the depths of the n type semiconductor regions N2 and N3 are the same as those of the conventional technique, and the p type semiconductor region P4 with a high impurity concentration is formed deeply. More specifically, the n type semiconductor regions N2 and N3 are formed over a depth of about 2 to 20 μm from the front surface of the semiconductor substrate 1, and the p type semiconductor region P4 is formed over a depth of about 30 to 40 μm from the front surface of the semiconductor substrate 1. Also, on the back surface side of the semiconductor substrate 1, the n type semiconductor region N4 is formed over a depth of about 2 to 20 μm from the back surface of the semiconductor substrate 1, and the p type semiconductor region P5 is formed over a depth of about 30 to 40 μm from the back surface of the semiconductor substrate 1.

As described above, in the third embodiment, since the p type semiconductor regions P4 and P5 are formed more deeply than those of the conventional technique, the p type impurity concentration is relatively high even in the region deep from the front surface and the back surface of the semiconductor substrate 1. Therefore, since the voltage fluctuation in the p type semiconductor region P4 can be reduced in comparison with the conventional technique, the commutation characteristics of the triac can be improved in comparison with the conventional technique.

In the foregoing, the invention made by the inventors of the present invention has been concretely described based on the embodiments. However, it is needless to say that the present invention is not limited to the foregoing embodiments and various modifications and alterations can be made within the scope of the present invention.

Besides, some contents described in the embodiments will be described below.

A semiconductor device includes: a semiconductor substrate of a first conductivity type having a first main surface and a second main surface on a side opposite to the first main surface; a first semiconductor region of a second conductivity type formed on a first main surface side of the semiconductor substrate; a second semiconductor region of the second conductivity type formed so as to be enclosed by the first semiconductor region when seen in a plan view on the first main surface side of the semiconductor substrate; third and fourth semiconductor regions of the first conductivity type formed away from each other so as to be enclosed by the second semiconductor region on the first main surface side of the semiconductor substrate; a fifth semiconductor region of the second conductivity type formed on a second main surface side of the semiconductor substrate; a sixth semiconductor region of the first conductivity type formed so as to be enclosed by the fifth semiconductor region on the second main surface side of the semiconductor substrate; a substrate region of the first conductivity type composed of a part of the semiconductor substrate and interposed between the first and second semiconductor regions and the fifth semiconductor region; a first electrode formed on the first main surface of the semiconductor substrate so as to be in contact with the second and third semiconductor regions; a second electrode formed on the first main surface of the semiconductor substrate so as to be in contact with the second and fourth semiconductor regions; and a third electrode formed on the second main surface of the semiconductor substrate so as to be in contact with the fifth and sixth semiconductor regions, a first thyristor is formed of the fifth semiconductor region, the substrate region, the second semiconductor region and the third semiconductor region between the third electrode and the first electrode, a second thyristor is formed of the second semiconductor region, the substrate region, the fifth semiconductor region and the sixth semiconductor region between the first electrode and the third electrode, directions of a current flowing between the first electrode and the third electrode are opposite to each other in the first thyristor and the second thyristor, impurity concentrations of the second and fifth semiconductor regions are higher than an impurity concentration of the first semiconductor region, impurity concentrations of the third, fourth and sixth semiconductor regions are higher than an impurity concentration of the substrate region, and a depth from the first main surface of the semiconductor substrate to a bottom surface of the second semiconductor region is the same as a depth from the first main surface of the semiconductor substrate to a bottom surface of the first semiconductor region or is larger than the depth from the first main surface of the semiconductor substrate to the bottom surface of the first semiconductor region.

What is claimed is:

1. A semiconductor device comprising:
a semiconductor substrate of a first conductivity type having a first main surface and a second main surface on a side opposite to the first main surface;
a first semiconductor region of a second conductivity type formed on a first main surface side of the semiconductor substrate;
a second semiconductor region of the second conductivity type formed so as to be enclosed by the first semiconductor region on the first main surface side of the semiconductor substrate;
third and fourth semiconductor regions of the first conductivity type formed away from each other so as to be enclosed by the second semiconductor region on the first main surface side of the semiconductor substrate;
a fifth semiconductor region of the second conductivity type formed on a second main surface side of the semiconductor substrate;
a sixth semiconductor region of the first conductivity type formed so as to be enclosed by the fifth semiconductor region on the second main surface side of the semiconductor substrate;
a substrate region of the first conductivity type composed of a part of the semiconductor substrate and interposed between the first semiconductor region and the fifth semiconductor region;
a seventh semiconductor region of the second conductivity type interposed between the fifth semiconductor region and the substrate region;
a first electrode formed on the first main surface of the semiconductor substrate so as to be in contact with the second and third semiconductor regions;
a second electrode formed on the first main surface of the semiconductor substrate so as to be in contact with the second and fourth semiconductor regions; and
a third electrode formed on the second main surface of the semiconductor substrate so as to be in contact with the fifth and sixth semiconductor regions,
wherein a first thyristor is formed of the fifth semiconductor region, the seventh semiconductor region, the substrate region, the first semiconductor region, the second semiconductor region and the third semiconductor region between the third electrode and the first electrode,
a second thyristor is formed of the second semiconductor region, the first semiconductor region, the substrate region, the seventh semiconductor region, the fifth semiconductor region and the sixth semiconductor region between the first electrode and the third electrode,
directions of a current flowing between the first electrode and the third electrode are opposite to each other in the first thyristor and the second thyristor,
impurity concentrations of the second and fifth semiconductor regions are higher than impurity concentrations of the first and seventh semiconductor regions,
impurity concentrations of the third, fourth and sixth semiconductor regions are higher than an impurity concentration of the substrate region, and
distances from bottom surfaces of the third and fourth semiconductor regions of the first conductivity type to a bottom surface of the second semiconductor region of the second conductivity type are larger than a distance from a bottom surface of the second semiconductor region of the second conductivity type to a bottom surface of the first semiconductor region of the second conductivity type.

2. The semiconductor device according to claim 1, wherein depths from the first main surface of the semiconductor substrate to the respective bottom surfaces of the third and fourth semiconductor regions are 20 μm or more.

3. The semiconductor device according to claim 1, wherein a difference between a depth from the first main surface of the semiconductor substrate to the bottom surface of the second semiconductor region and a depth from the first main surface of the semiconductor substrate to the bottom surface of the first semiconductor region is less than 10 μm.

4. The semiconductor device according to claim 1, further comprising:
an eighth semiconductor region of the second conductivity type formed in an outer circumferential region of the semiconductor substrate.

5. The semiconductor device according to claim 4, further comprising:
  a ninth semiconductor region of the first conductivity type with an impurity concentration higher than that of the substrate region, the ninth semiconductor region being formed between the first semiconductor region and the eighth semiconductor region on the first main surface side of the semiconductor substrate; and
  a fourth electrode formed so as to be in contact with the ninth semiconductor region on the first main surface of the semiconductor substrate.

6. A semiconductor device comprising:
  a semiconductor substrate of a first conductivity type having a first main surface and a second main surface on a side opposite to the first main surface;
  a first semiconductor region of a second conductivity type formed on a first main surface side of the semiconductor substrate;
  a second semiconductor region of the second conductivity type formed so as to be enclosed by the first semiconductor region when seen in a plan view on the first main surface side of the semiconductor substrate;
  third and fourth semiconductor regions of the first conductivity type formed away from each other so as to be enclosed by the second semiconductor region on the first main surface side of the semiconductor substrate;
  a fifth semiconductor region of the second conductivity type formed on a second main surface side of the semiconductor substrate;
  a sixth semiconductor region of the first conductivity type formed so as to be enclosed by the fifth semiconductor region on the second main surface side of the semiconductor substrate;
  a substrate region of the first conductivity type composed of a part of the semiconductor substrate and interposed between the first and second semiconductor regions and the fifth semiconductor region;
  a first electrode formed on the first main surface of the semiconductor substrate so as to be in contact with the second and third semiconductor regions;
  a second electrode formed on the first main surface of the semiconductor substrate so as to be in contact with the second and fourth semiconductor regions; and
  a third electrode formed on the second main surface of the semiconductor substrate so as to be in contact with the fifth and sixth semiconductor regions,
  wherein a first thyristor is formed of the fifth semiconductor region, the substrate region, the second semiconductor region and the third semiconductor region between the third electrode and the first electrode,
  a second thyristor is formed of the second semiconductor region, the substrate region, the fifth semiconductor region and the sixth semiconductor region between the first electrode and the third electrode,
  directions of a current flowing between the first electrode and the third electrode are opposite to each other in the first thyristor and the second thyristor,
  impurity concentrations of the second and fifth semiconductor regions are higher than an impurity concentration of the first semiconductor region,
  impurity concentrations of the third, fourth and sixth semiconductor regions are higher than an impurity concentration of the substrate region, and
  a depth from the first main surface of the semiconductor substrate to a bottom surface of the second semiconductor region is the same as a depth from the first main surface of the semiconductor substrate to a bottom surface of the first semiconductor region or is larger than the depth from the first main surface of the semiconductor substrate to the bottom surface of the first semiconductor region.

7. The semiconductor device according to claim 6,
  wherein a difference between a depth from the first main surface of the semiconductor substrate to the bottom surface of the second semiconductor region and a depth from the first main surface of the semiconductor substrate to the bottom surface of the first semiconductor region is less than 5 μm.

8. The semiconductor device according to claim 6, further comprising:
  an eighth semiconductor region of the second conductivity type formed in an outer circumferential region of the semiconductor substrate.

9. The semiconductor device according to claim 8, further comprising:
  a ninth semiconductor region of the first conductivity type with an impurity concentration higher than that of the substrate region, the ninth semiconductor region being formed between the first semiconductor region and the eighth semiconductor region on the first main surface side of the semiconductor substrate; and
  a fourth electrode formed so as to be in contact with the ninth semiconductor region on the first main surface of the semiconductor substrate.

* * * * *